United States Patent
Bao et al.

(10) Patent No.: US 10,680,083 B2
(45) Date of Patent: Jun. 9, 2020

(54) OXIDE ISOLATED FIN-TYPE FIELD-EFFECT TRANSISTORS

(71) Applicant: International Business Machines Corporation, Armonk, NY (US)

(72) Inventors: Ruqiang Bao, Niskayuna, NY (US); Hemanth Jagannathan, Niskayuna, NY (US); Paul C. Jamison, Hopewell Junction, NY (US); Choonghyun Lee, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 3 days.

(21) Appl. No.: 16/133,763

(22) Filed: Sep. 18, 2018

(65) Prior Publication Data

US 2020/0091319 A1    Mar. 19, 2020

(51) Int. Cl.
*H01L 21/00* (2006.01)
*H01L 29/66* (2006.01)
*H01L 29/78* (2006.01)
*H01L 21/762* (2006.01)

(52) U.S. Cl.
CPC .. *H01L 29/66795* (2013.01); *H01L 21/76205* (2013.01); *H01L 21/76224* (2013.01); *H01L 29/785* (2013.01)

(58) Field of Classification Search
CPC ......... H01L 29/66795; H01L 21/76205; H01L 21/76224
See application file for complete search history.

(56) References Cited

U.S. PATENT DOCUMENTS

| | | | |
|---|---|---|---|
| 9,202,917 B2* | 12/2015 | Ching | H01L 29/785 |
| 9,224,865 B2 | 12/2015 | Akarvardar et al. | |
| 9,362,362 B2 | 6/2016 | Cheng et al. | |
| 9,608,059 B2 | 3/2017 | Cappellani et al. | |
| 9,716,046 B1 | 7/2017 | Cheng et al. | |
| 9,716,174 B2 | 7/2017 | Akarvardar et al. | |
| 9,947,773 B2 | 4/2018 | Ching et al. | |
| 10,229,856 B2* | 3/2019 | Ando | H01L 29/0653 |
| 10,249,540 B2* | 4/2019 | Ando | H01L 29/0653 |
| 10,431,660 B2* | 10/2019 | Cheng | H01L 29/785 |
| 2016/0268434 A1* | 9/2016 | Ching | H01L 29/7851 |
| 2017/0005190 A1* | 1/2017 | Chang | H01L 29/785 |

(Continued)

OTHER PUBLICATIONS

IBM "List of IBM Patents or Patent Applications Treated As Related; (Appendix P)", Filed Sep. 18, 2018, 2 pages.

(Continued)

*Primary Examiner* — Laura M Menz
(74) *Attorney, Agent, or Firm* — Cantor Colburn LLP; Vazken Alexanian

(57) ABSTRACT

According to an embodiment of the present invention, a semiconductor structure includes a semiconductor substrate and a plurality of fins located on the semiconductor substrate. The plurality of fins each independently includes a bottom fin portion, a top fin portion layer, and an isolated oxide layer located in between the bottom fin portion and the top fin portion layer in the y-direction parallel to the height of the plurality of fins. The isolated oxide layer includes a mixed oxide region located in between oxidized regions in an x-direction perpendicular to the height of the plurality of fins.

10 Claims, 7 Drawing Sheets

(56) References Cited

U.S. PATENT DOCUMENTS

| | | | | |
|---|---|---|---|---|
| 2018/0337097 A1* | 11/2018 | Ando | .................. | H01L 29/16 |
| 2018/0337098 A1* | 11/2018 | Ando | .............. | H01L 21/823807 |
| 2019/0245049 A1* | 8/2019 | Cheng | .................. | H01L 29/785 |
| 2019/0348512 A1* | 11/2019 | Cheng | ............... | H01L 29/66795 |
| 2019/0348513 A1* | 11/2019 | Cheng | .................. | H01L 21/324 |
| 2020/0006533 A1* | 1/2020 | Tsai | .................... | H01L 29/785 |

OTHER PUBLICATIONS

K. Cheng et al., "Bottom oxidation through STI (BOTS)—A novel approach to fabricate dielectric isolated FinFETs on bulk substrates," Symposium on VLSI Technology, 2014, 2 pages.

R. H. Chao et al., "Bottom Channel Isolation in Nanosheet Transistors," U.S. Appl. No. 15/493,730, filed Apr. 21, 2017.

* cited by examiner

OXIDE ISOLATED FIN-TYPE FIELD-EFFECT TRANSISTORS

BACKGROUND

The present invention relates to an oxide isolate fin-type field-effect transistor (FinFET) component and a method of forming the same.

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as FinFET devices, have become more prevalent as device dimensions continue to scale down. FinFET devices are three-dimensional structures that have a conducting channel including a fin of semiconductor material that rises above a substrate as a three-dimensional structure. A gate structure, configured to control the flow of charge carriers within the conducting channel wraps around the fin of semiconductor material. For example, in a tri-gate FinFET structure, the gate structure wraps around three sides of the fin of semiconductor material, thereby forming conductive channels on three sides of the fin.

SUMMARY

According to an embodiment of the present invention, a semiconductor structure includes a semiconductor substrate and a plurality of fins located on the semiconductor substrate. The plurality of fins each independently includes a bottom fin portion, a top fin portion layer, and an isolated oxide layer located in between the bottom fin portion and the top fin portion layer in the y-direction parallel to the height of the plurality of fins. The isolated oxide layer includes a mixed oxide region located in between oxidized regions in an x-direction perpendicular to the height of the plurality of fins.

According to another embodiment, a method of forming a semiconductor structure includes patterning a plurality of fins on a layered substrate including a semiconductor substrate, a top fin portion layer, and a sacrificial layer including a silicon germanium located in between the semiconductor substrate and the top fin portion layer. The sacrificial layer is selectively etched to from recesses. A germanium oxide layer is deposited on the plurality of fins and in the recesses. The structure is annealed in an inert environment to reduce the germanium oxide in the germanium oxide layer and oxidize the silicon in the sacrificial layer to form a concentrated germanium region located in between oxidized regions. The concentrated germanium region has a higher concentration of germanium than the sacrificial layer. The structure is then oxidized to convert the germanium in the concentrated germanium region to silicon germanium oxide thereby forming a mixed oxide region located in between the oxidized regions.

BRIEF DESCRIPTION OF THE DRAWINGS

Refer now to the figures, which are exemplary embodiments, and wherein the like elements are numbered alike.

FIGS. 2-10 depict fabrication operations for forming selected portions of the semiconductor structure shown in FIG. 1, in which:

FIG. 2 is a cross-sectional view of the semiconductor structure prior to forming the fins according to embodiments of the invention;

FIG. 3 is a cross-sectional view of the semiconductor structure after formation of the fins according to embodiments of the invention;

FIG. 4 is a cross-sectional view of the semiconductor structure after recessing of the sacrificial layer according to embodiments of the invention;

FIG. 6 is a cross-sectional view of the semiconductor structure after removal of the germanium oxide region according to embodiments of the invention;

FIG. 8 is a cross-sectional view of the semiconductor structure after deposition of the fill layer according to embodiments of the invention;

FIG. 9 is a cross-sectional view of the semiconductor structure after removal of a portion of the fill layer according to embodiments of the invention;

FIG. 10 is a cross-sectional view of the semiconductor structure after removal of the mask according to embodiments of the invention.

DETAILED DESCRIPTION

For the sake of brevity, conventional techniques related to semiconductor devices and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Current bulk FinFETs utilize a punch through stopper layer below the active fin to suppress the off-state current. The punch through stopper layer disadvantageously results in undesired channel doping during the downstream thermal processing that ultimately leads to performance degradation of the device due to variation in threshold voltage and mobility degradation.

In accordance with aspects of the invention, the above-described shortcomings are addressed by a FinFET device architecture, where the fins of the FinFET device include an isolated oxide layer that separates a bottom fin portion from the active, top fin portion. The isolated oxide layer can help reduce or eliminate dopant diffusion into the active fin portion from the punch-through stopper layer and can reduce or eliminate parasitic channel formation in the bottom fin portion due to out-diffusion of dopants from the source layer and/or the drain layer.

Figure 1:
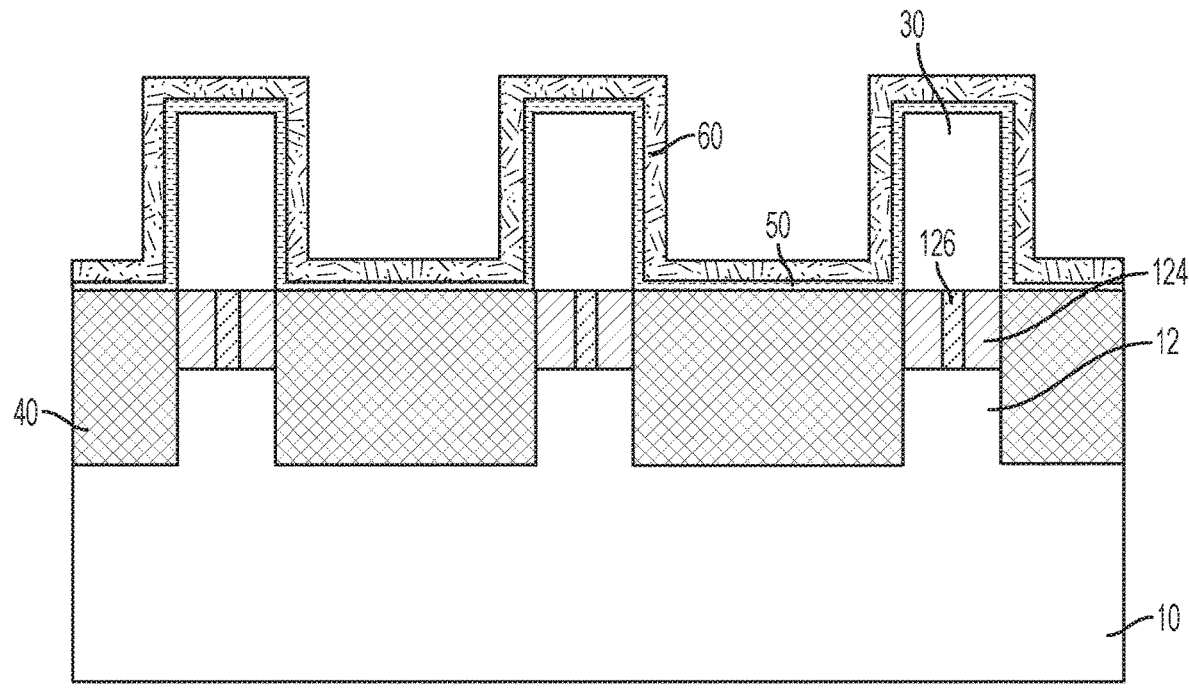
FIG. 1 is a cross-sectional view of a semiconductor structure including three fins fabricated according to embodiments of the invention.

The isolated oxide layer in the fin can be formed by imposing a low temperature anneal to react silicon and germanium in a sacrificial layer located in the fin with germanium oxide in neighboring germanium oxide layers in an inert atmosphere to form a concentrated germanium region having a higher germanium concentration than the initial sacrificial layer and to form neighboring oxidized silicon regions. Subsequently, a low temperature thermal oxidation of the fin can be imposed to oxidize the concentrated germanium region to form a mixed oxide region that includes both germanium oxide and silicon oxide located in between the neighboring oxidized silicon regions. It is noted that the material of the concentrated germanium region, for example, silicon germanium, is substantially more susceptible to oxidation than the material of the active, top fin portion of the fin and the material of the bottom portion of the fin. This difference effectively allows for the selective oxidation of the concentrated germanium region without damage to the active top portion of the fin, to the bottom portion of the fin, or to the semiconductor substrate layer FIG. 1 illustrates an embodiment of the present semiconductor device that includes three fins formed on a semiconductor substrate 10, wherein each of the fins is depicted in FIG. 1 as including a bottom fin portion 12, oxide layers 124, 126, and an active top fin portion 30. The thickness of the isolated oxide layer in the y-direction can be 5 to 200 nanometers, or 5 to 50 nanometers, or 5 to 20 nanometers, or 20 to 100 nanometers. The isolated oxide layers include a mixed oxide region 126 and oxidized silicon regions 124. The mixed oxide region 126 can be located in between two oxidized silicon regions 124, in the x-direction perpendicular to the direction of the fin height. A discrete boundary between the mixed oxide region 126 and oxidized silicon regions 124 may or may not exist and can include a sharp or smooth gradient in germanium concentration from one region to the next.

The bottom fin portion 12 and the top fin portion 30 are located below and above the isolated oxide layer, respectively, in the y-direction parallel to the fin height. Fill layer 40 can be located on the semiconductor substrate layer 10 in between the fins. High k layer 50 can be located on the top and side surfaces of the top fin portion layer 30 and on the fill layer 40. Conductive layer 60 can be located on high k layer 50.

FIGS. 2-9 illustrate various semiconductor devices after fabrication operations have been performed in accordance with embodiments of the present invention. The semiconductor structures shown in FIGS. 2-9 represent selected portions of the semiconductor device shown in FIG. 1. The novel aspects of the invention can be applied to a wide range of FET architectures that utilize fin field effect transistors.

Figure 2:
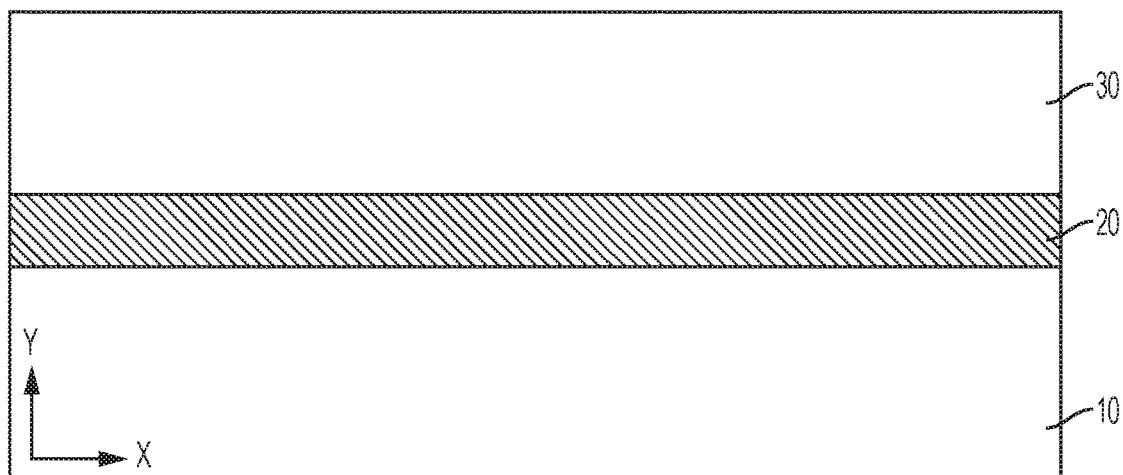

FIG. 2 illustrates that sacrificial layer 20 can be deposited on the semiconductor layer 10 followed by deposition of a top fin portion layer 30. Known fabrication operations are used to deposit the sacrificial layer 20 and the top fin portion layer 30. For example, sacrificial layer 20 and top fin portion layer 30 can each independently be formed by chemical vapor deposition (CVD), liquid phase (LP) chemical vapor deposition, reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

Sacrificial layer 20 includes silicon and germanium. Sacrificial layer 20 can include 10 to 60 atomic percent (atomic %), or 20 to 60 atomic %, or 20 to 50 atomic %, or 35 to 45 atomic % of germanium based on the total atoms of the sacrificial layer. The thickness of the sacrificial layer 20 in the y-direction can be 5 to 200 nanometers, or 5 to 50 nanometers, or 5 to 20 nanometers, or 20 to 100 nanometers. The sacrificial layer 20 can include silicon and germanium in the form of $Si_{(1-x)}Ge_x$, where x can be 0.1 to 0.6, or 0.2 to 0.5.

The top fin portion layer 30 will define the active fin of the semiconductor device. The thickness of the top fin portion layer 30 in the y-direction can be 10 to 200 nanometers, or 30 to 60 nanometers.

Figure 3:
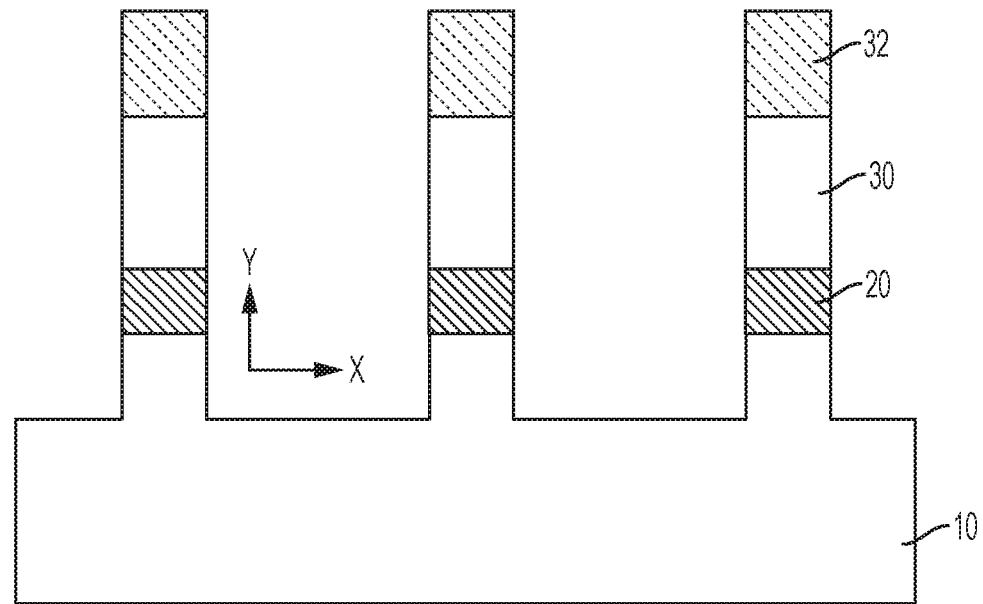

In FIG. 3, known fabrication operations are used to mask a portion of the surface with a mask layer 32 followed by etching to remove portions of the substrate to form the fins. The etching include etching through the top fin portion layer 30, through the sacrificial layer 20, and into the semiconductor substrate layer 10. Non-limiting examples of suitable etching processes include dry etch such as reactive ion etching, a remote plasma, or chemical vapor/sublimation. Alternatively, the etch process include a wet etch with an aqueous solution.

A height in the y-direction of the fins can be 10 to 200 nanometers, or 30 to 60 nanometers. A width in the x-direction of the fins can be 5 to 15 nanometers, or 5 to 10 nanometers.

Figure 4:
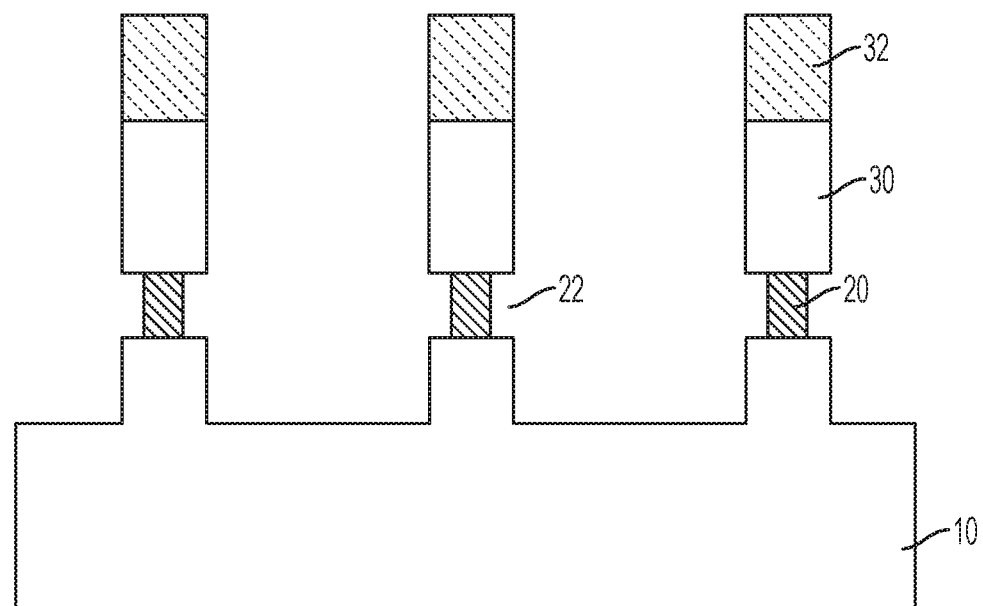

In FIG. 4, known fabrication operations are used to selectively etch into the sacrificial layer in the x-direction perpendicular to the height of the fin to form a recess 22. The selective etch can result in 5 to 60 volume percent, or 10 to 45 volume percent of the sacrificial layer 20 being removed. If too much volume is removed the fin stability can be reduced and can result in fin collapse. The etching can be a reactive ion etch, a wet etch, or a dry etch.

Figure 5A:
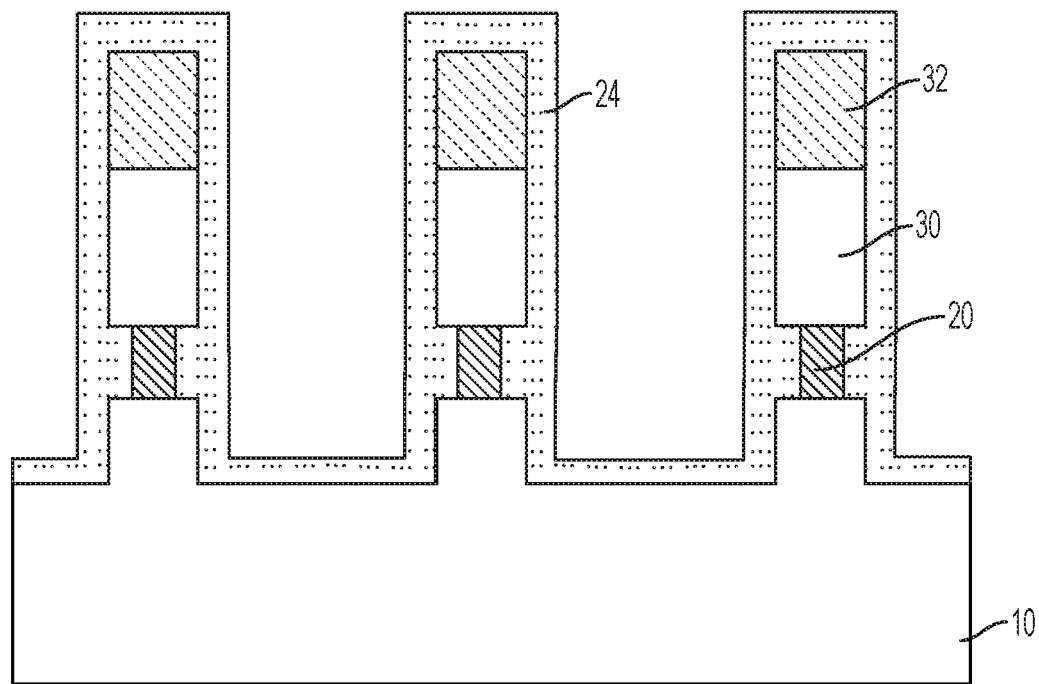
FIG. 5A is a cross-sectional view of the semiconductor structure after deposition of the germanium oxide layer according to embodiments of the invention.
Figure 5B:
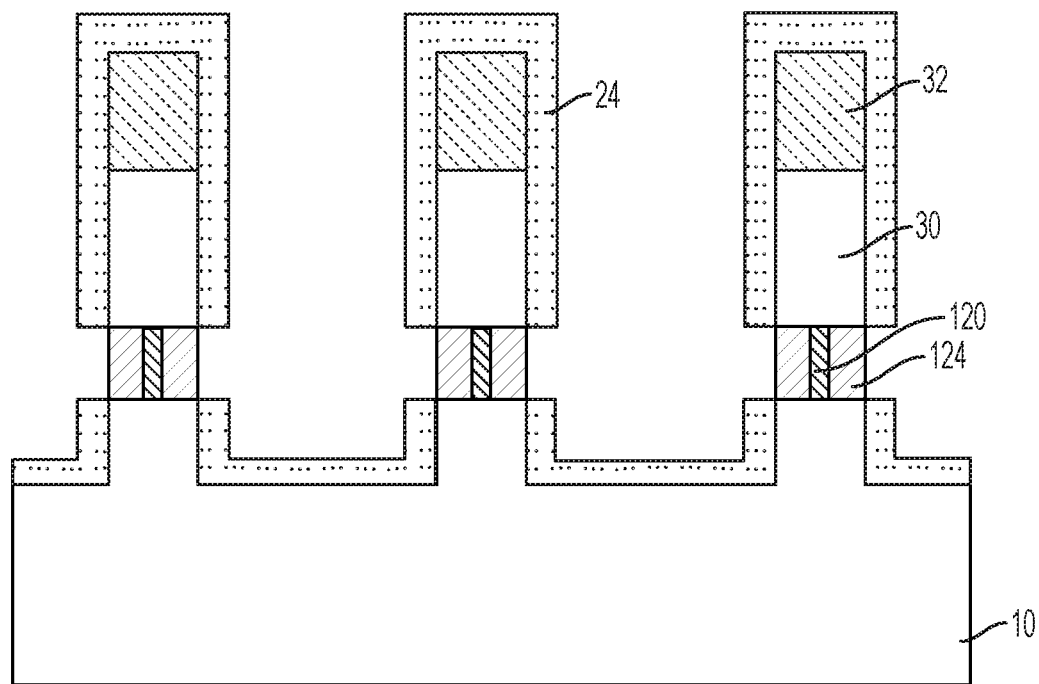
FIG. 5B is a cross-sectional view of the semiconductor structure after annealing to form the concentrated germanium region according to embodiments of the invention.
Figure 5C:
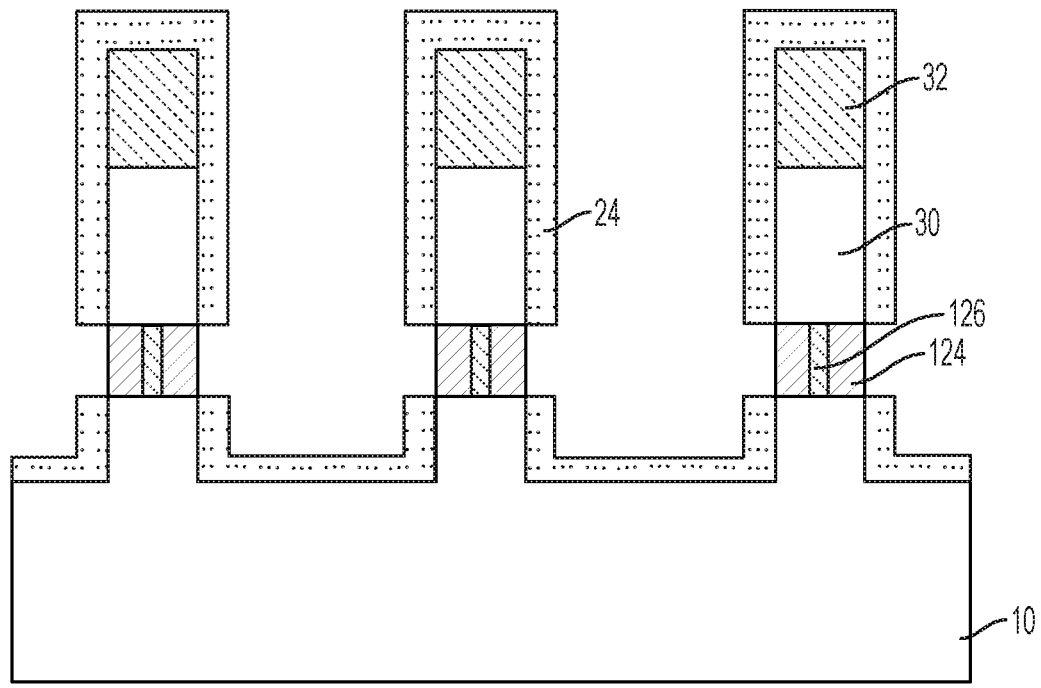
FIG. 5C is a cross-sectional view of the semiconductor structure after oxidizing to form the mixed oxide region according to embodiments of the invention.

FIG. 5A-5C illustrate a first embodiment of forming the isolated oxide layer. FIG. 5A illustrates that germanium oxide layer 24 can be deposited on the fins. The germanium oxide layer 24 can include less than or equal to 50 atomic %, or 10 to 50 atomic %, or 35 to 45 atomic % of germanium based on the total atoms of the germanium oxide layer 24. Germanium oxide layer 24 can be deposited by know fabrication methods such as by atomic layer deposition (ALD). Germanium oxide layer 24 can located on a surface of the semiconductor substrate 10, sacrificial layer 20, top fin portion layer 30, and on mask layer 32. Deposition of the germanium oxide layer 24 therefore results in the middle region having the sacrificial layer 20 located in between two outer germanium oxide layers 24.

FIG. 5B illustrates the device after a low temperature anneal. The low temperature anneal causes reduction of the germanium oxide in the germanium oxide layer 24 and oxidation of the silicon in the sacrificial layer 20. Specifically, the reaction can be illustrated as: $Si+Ge+2GeO_2 \rightarrow Ge+2GeO+SiO_2$. Therefore, the reaction results in 1) an increase in the germanium content of the sacrificial layer to form concentrated germanium region 120 and 2) a depletion of germanium from the germanium oxide layer 24 and oxidation of the silicon to form oxidized silicon region 124. It is noted that an amount of germanium leaves the device during this reaction as the volatile species GeO. The low temperature anneal therefore results in the middle portion having the concentrated germanium region 120 sandwiched between two outer oxidized silicon regions 124.

The low temperature anneal can be performed in an inert environment, for example, including at least one of nitrogen, argon, or helium. The low temperature anneal can occur at an anneal temperature of 500 to 800 degrees Celsius (° C.), or 500 to 700° C., or 550 to 650° C. The low temperature anneal can occur for 1 second to 1 minute.

The concentrated germanium region 120 includes an increased amount of germanium as compared to germanium oxide layer 24. For example, the concentration of the germanium in the concentrated germanium region 120 can be greater than or equal to 20 atomic %, or 30 to 60 atomic % more, or 40 to 60 atomic % more than the concentration of the germanium oxide layer 24. The concentrated germanium region 120 can include greater than or equal to 20 atomic %, 20 to 80 atomic %, or 45 to 80 atomic %, or 55 to 70 atomic % of germanium based on the total atoms in the concentrated germanium region 120. The concentrated germanium region 120 can include silicon and germanium in the form of $Si_{(1-x)}Ge_x$, where x can be 0.4 to 0.8, or 0.5 to 0.7. Concurrently, the oxidized silicon region 124 includes a decreased amount of germanium as compared to the germanium oxide layer 24, for example, the oxidized silicon region 124 can comprise pure silicon oxide. The oxidized silicon region 124 can include less than or equal to 10 atomic %, or 0 to 5 atomic % of germanium based on the total atoms of the oxidized silicon region.

FIG. 5C illustrates the device after an oxidation step to convert the germanium in the concentrated germanium region 120 to germanium oxide to form mixed oxide region 126. The oxidation step therefore results in the middle portion of the fin having the mixed oxide region 126 located in between two outer oxidized silicon regions 124. The oxidation step can occur at a temperature of 200 to 800° C., 300 to 600° C., or 200 to 600° C., or 300 to 500° C. The oxidation step can occur for 10 minutes to 4 hours, or 1 to 2 hours. The oxidation step can include thermal oxidation at a temperature of 300 to 600° C. The oxidation step can include an ozone oxidation at 200 to 400° C. It is noted that full oxidation or as close to full oxidation of the concentrated germanium region 120 as possible can be desired as the more germanium (i.e. not in the form of germanium oxide) that remains in the fins, the higher the likelihood of reducing the level of electrical isolation. After the thermal oxidation, 90 to 100 atomic % of the germanium atoms in the mixed oxide region can be bonded to oxygen as germanium oxide based on the total atoms of germanium in the mixed oxide region.

Figure 6:
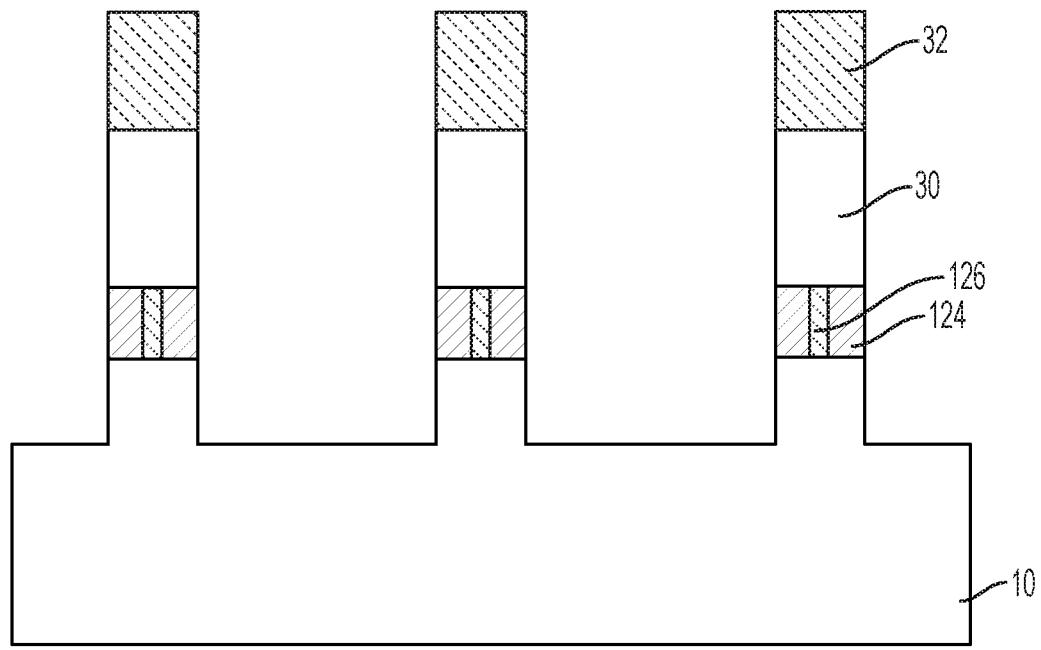

The prepared fins are illustrated in FIG. 6 that illustrates the device after removal of the germanium oxide layer 24. Removal of the germanium oxide layer 24 can be performed by known operations such as by a selective wet etch of the germanium oxide. It is noted that the oxidation step can occur before or after removal of germanium oxide layer 24.

Figure 7A:
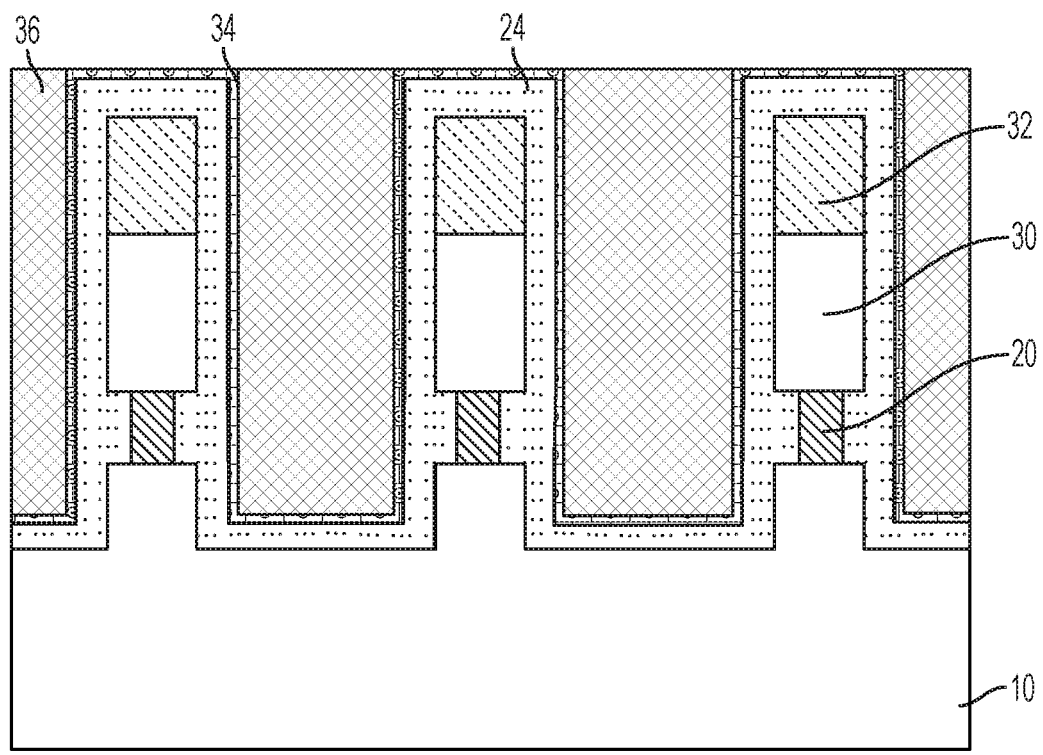
FIG. 7A is a cross-sectional view of the semiconductor structure after deposition of the germanium oxide layer and stabilizing layers according to embodiments of the invention.
Figure 7B:
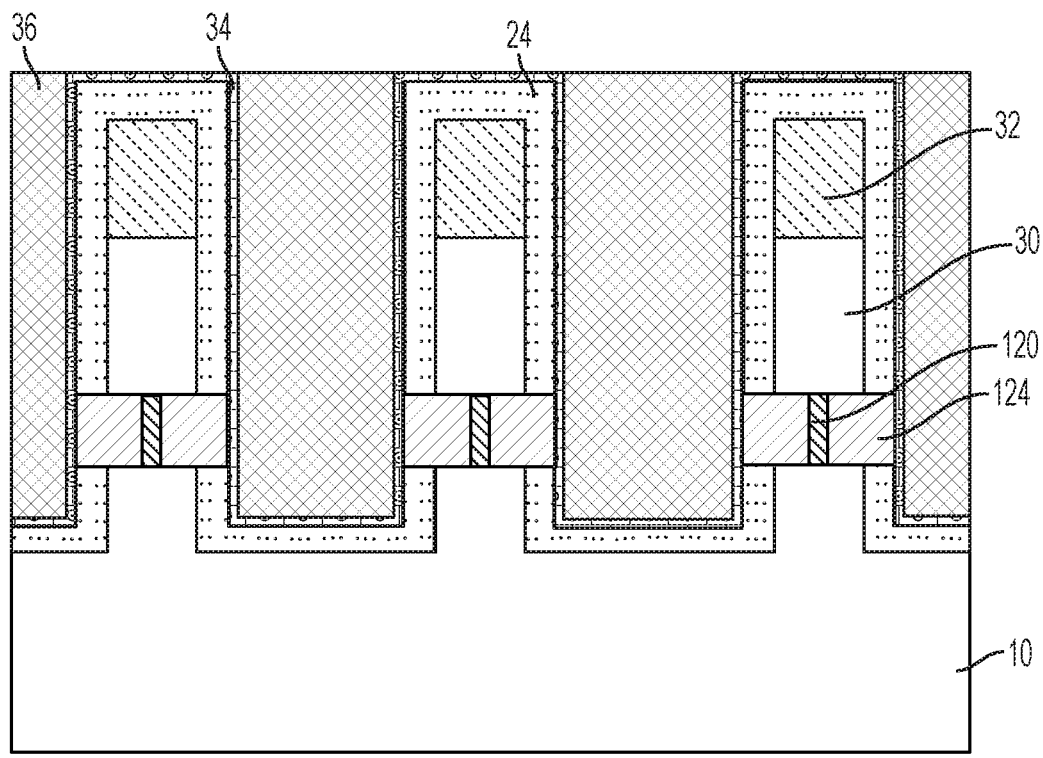
FIG. 7B is a cross-sectional view of the semiconductor structure after annealing to form the concentrated germanium region according to embodiments of the invention.

FIGS. 7A-7B illustrate a second embodiment of forming the isolated oxide layer. Similar to FIG. 5A, FIG. 7A illustrates that the germanium oxide layer 24 can be deposited on the fins. FIG. 7A further illustrates that in addition to the deposition of the germanium oxide layer 24, one or both of a nitride layer 34 and a mechanical fill layer 36 can be deposited on the germanium oxide layer 24. This embodiment can be preferential over the first embodiment as the presence of the nitride layer 34 and the mechanical fill layer 36 can improve the mechanical stability of the fins during the low temperature anneal and oxidation steps. For fins that do not need the extra support, the first embodiment has the benefit of a reduced number of fabrication steps.

The nitride layer 34 can include at least one of silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), or silicon oxy-carbonitride (SiOCN).

The mechanical fill layer 36 can include at least one of silicon oxide, silicon nitride, silicon oxynitride, hafnium oxide, zirconium oxide, aluminum oxide, titanium oxide, lanthanum oxide, strontium titanate, lanthanum aluminate, hafnium silicon oxide, or zirconium silicon oxide. The mechanical fill layer 36 can be formed using a high aspect ratio process, for example, via sub-atmospheric chemical vapor deposition.

FIG. 7B illustrates the device after the low temperature anneal. Similar to FIG. 5B, the low temperature anneal causes reduction of the germanium oxide in the germanium oxide layer 24 and oxidation of the silicon in the sacrificial layer 20, resulting in the middle portion having the concentrated germanium region 120 located in between two outer oxidized silicon regions 124.

After the low temperature anneal, the mechanical fill layer 36, the nitride layer 24, and the germanium oxide layer 34 are removed and the device is subjected to the oxidation step to convert the germanium of the concentrated germanium region 120 to germanium oxide to form mixed oxide region 126. The oxidation step therefore results in the middle portion having the mixed oxide region 126 sandwiched between two outer oxidized silicon regions 124. The resulting device is illustrated in FIG. 6. Removal of the mechanical fill layer 36, the nitride layer 24, and the germanium oxide layer 34 can be accomplished by known operations. The oxidation step can occur before or after removal of the germanium oxide layer 34.

Figure 8:
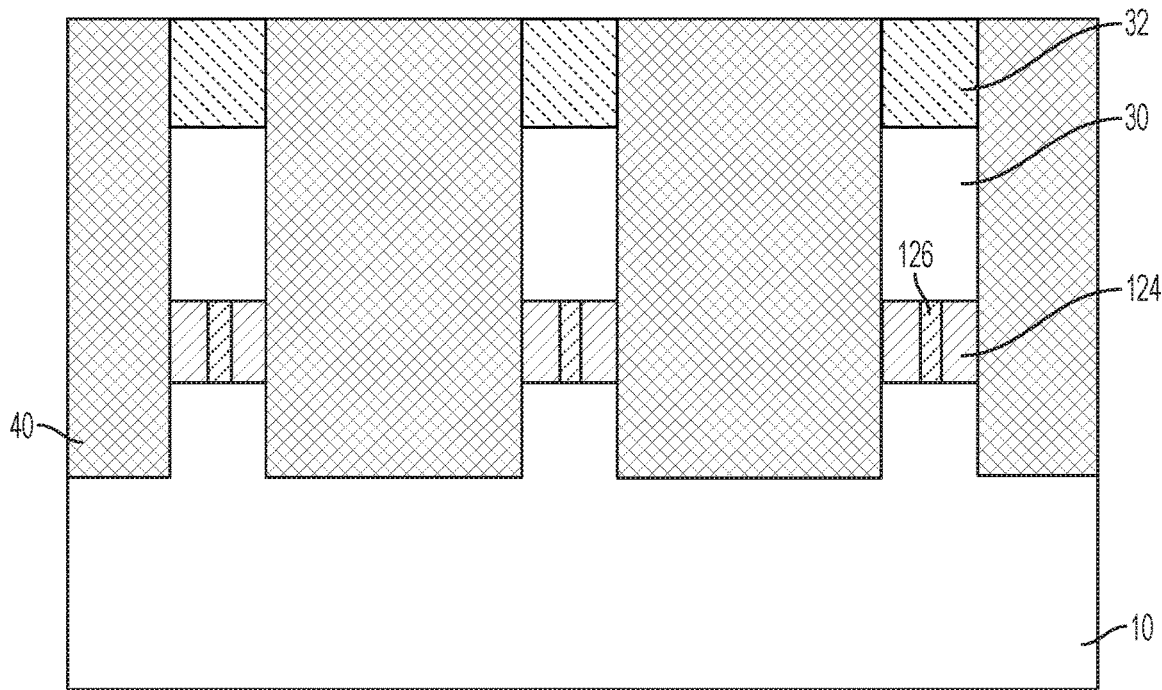

FIG. 8 illustrates that after the oxidation step, the spaces in between the fins can be filled with fill layer 40. Fill layer 40 can include at least one of silicon oxide, silicon oxide, silicon nitride, silicon oxynitride, hafnium oxide, zirconium oxide, aluminum oxide, titanium oxide, lanthanum oxide, strontium titanate, lanthanum aluminate, hafnium silicon oxide, or zirconium silicon oxide. The fill layer 40 can be formed using a high aspect ratio process, for example, via sub-atmospheric chemical vapor deposition. Following deposition of the fill layer 40, the surface can be planarized, for example, by chemical mechanical polishing.

Figure 9:
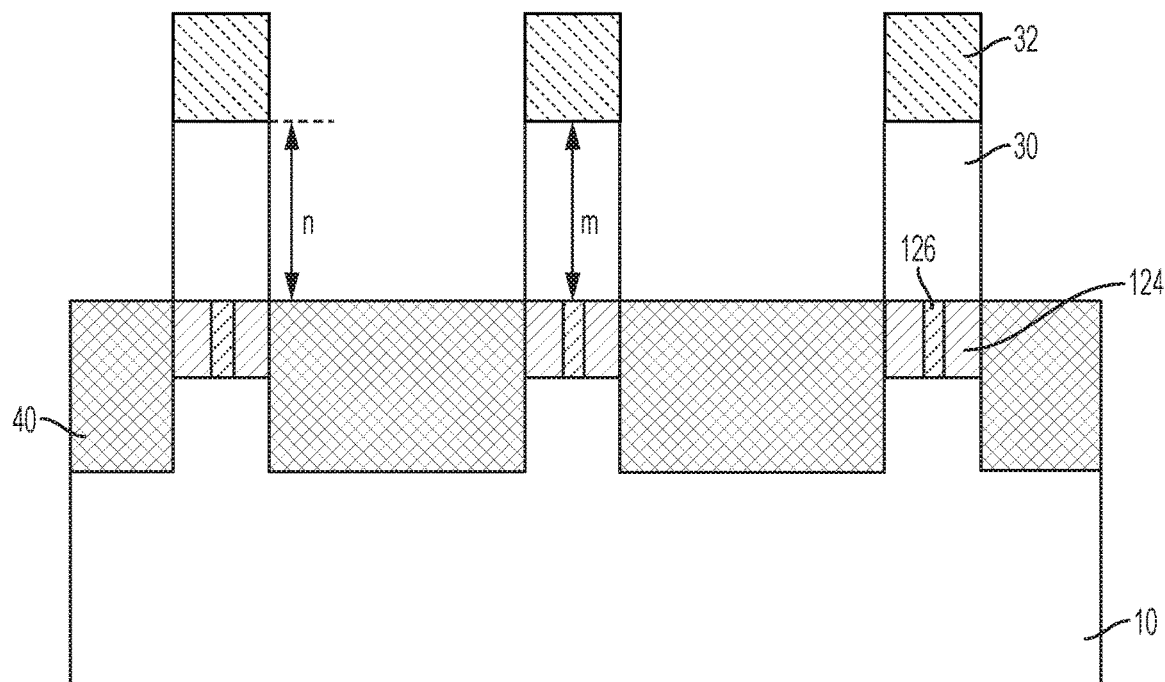

FIG. 9 illustrates that a fin recessing step can be performed to remove an amount of the fill layer 40 to expose the top fin portion layer 30 of the fins. The recessing can remove a depth, n, of the fill layer 40 as measured from the top of the top fin portion layer 30 to the upper surface of fill layer 40. This depth, n, can be the same or different as the height, m, of the top fin portion layer 30. The depth, n, can be within 20%, or within 10%, or within 5% of the height, m. The depth, n, can be less than the height, m, to ensure that none of the oxidized silicon region 124 gets removed during the recessing. The recessing can be performed by known operations such as isotropic dry etching or reactive ion etching.

Figure 10:
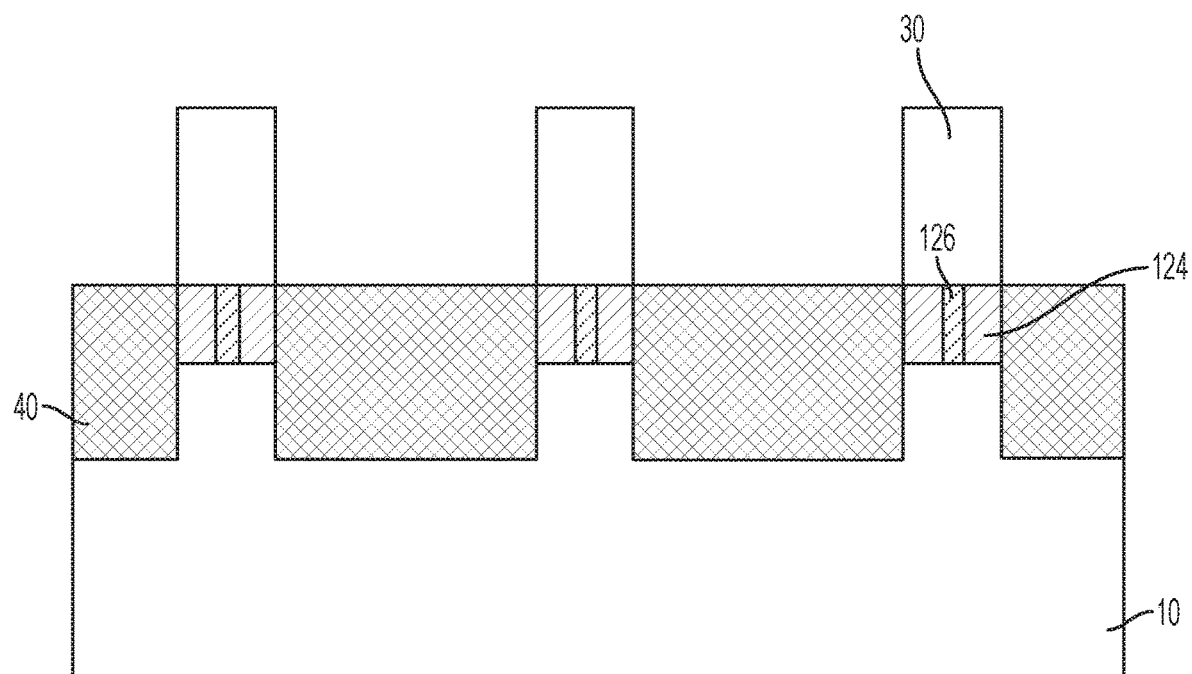

FIG. 10 illustrates the device after removal of the mask layer 32. The mask layer 32 can be removed using known operations. High k layer 50 and conductive layer 60 can then be deposited to form the device illustrated in FIG. 1. The high k layer 50 can have a dielectric constant k of greater than or equal 3.9, or greater than or equal to 5, or 5 to 20. The dielectric constant or permittivity can be measured at room temperature. The high k layer 50 can include a metal oxide such as at least one of hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, or lead zinc niobate. The high k layer 50 can include at least one of silicon nitride, hafnium dioxide, hafnium tantalum titanium oxide, hafnium silicate, nitrided hafnium silicates, hafnium oxynitride, zirconium dioxide, zirconium oxynitride, zirconium silicate, aluminum oxide, or germanium oxynitride. The high k layer 50 can include a dopants such as at least one of lanthanum, aluminum, or magnesium. The high k layer 50 can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. The high k layer can have a thickness of 1 to 5 nanometers.

The conductive layer 60 can include a p-type metal or an n-type metal depending upon whether the gate structure is a PFET or an NFET. The conductive layer 60 can include at least one of a doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), or gold (Au)), or a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO2), cobalt silicide (CoSi), nickel silicide (NiSi)), transition metal aluminides (e.g. Ti3Al, ZrAl), TaC, TaMgC, carbon nanotube, conductive carbon, or graphene). The conductive layer 60 can be formed by known operations such as atomic layer deposition (ALD), chemical vapor deposition (CVD), physical vapor deposition (PVD), sputtering, plating, evaporation, ion beam deposition, electron beam deposition, laser assisted deposition, chemical solution deposition, or the like.

The semiconductor substrate layer 10 can have a thickness of 0.1 to 750 micrometers. The semiconductor substrate layer 10 can include bulk Si and can have a thickness of 700 to 800 micrometers. The semiconductor substrate layer 10 can include at least one of silicon (Si), strained silicon, silicon carbide (SiC), germanium (Ge), silicon germanium (SiGe), silicon-germanium-carbon (SiGeC), a silicon alloy, a germanium alloy, gallium arsenide (GaAs), indium arsenide (InAs), indium phosphide (InP), cadmium arsenide, or cadmium selenide.

The semiconductor substrate layer 10 can include a semiconductor-on-insulator (SOI) (such as a silicon-on-insulator) and can have a thickness of 5 to 200 nanometers. The semiconductor substrate layer 10 can include a semiconductor-on-insulator (SOI) substrate with an optional insulator layer. The insulator layer can be a buried oxide (BOX) layer. The insulator layer can include an oxide, for example, silicon dioxide, or can include a nitride, for example, silicon nitride.

The top fin portion layer 30 can include the same or different material as semiconductor substrate layer 10. The top fin portion layer 30 can include a dopant, for example, p-type dopant (such as boron, indium, or a combination thereof) or an n-type dopant (such as phosphorus, arsenic, gallium, or a combination thereof).

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor structure, the method comprising:
    forming a plurality of fins on a layered substrate comprising a semiconductor substrate, a top fin portion layer, and a sacrificial layer located in between the semiconductor substrate and the top fin portion layer; wherein the sacrificial layer comprises a silicon germanium;
    selectively etching the sacrificial layer to form recesses in an x-direction perpendicular to a height of the plurality of fins;
    depositing a germanium oxide layer on the plurality of fins and in the recesses;
    annealing the structure in an inert environment to reduce the germanium oxide in the germanium oxide layer and oxidize the silicon in the sacrificial layer to form a concentrated germanium region located in between oxidized regions in the ex-direction perpendicular to the height of the plurality of fins, wherein the concentrated germanium region has a higher concentration of germanium than the lower concentration of germanium in the sacrificial layer and the oxidized regions comprise silicon oxide; and
    oxidizing the structure to convert the germanium in the concentrated germanium region to silicon germanium oxide thereby forming a mixed oxide region located in between the oxidized regions.

2. The method of claim 1, further comprising depositing at least one of a nitride layer or a mechanical fill layer prior to the annealing; and, if present, removing the nitride layer or the mechanical filler layer prior to the oxidizing.

3. The method of claim 1, wherein the selectively etching the sacrificial layer to form the recesses comprises removing 5 to 60 volume percent of the sacrificial layer.

4. The method of claim 1, wherein the annealing comprises heating to anneal temperature of 500 to 800° C.

5. The method of claim 1, wherein the oxidizing comprises heating on an oxidation temperature of 300 to 600° C.

6. The method of claim 1, wherein the concentrated germanium region comprises 20 to 80 atomic % of germanium based on the total atoms in the concentrated germanium region and the sacrificial layer comprises 10 to 50 atomic % of germanium based on the total atoms in the sacrificial layer.

7. The method of claim 1, wherein the oxidized regions each independently include 0 to 10 atomic % of germanium based on the total atoms of the oxidized region.

8. The method of claim 1, wherein 90 to 100 atomic % of the germanium atoms in the mixed oxide region can be bonded to oxygen as germanium oxide based on the total atoms of germanium in the mixed oxide region.

9. The method of claim 1, further comprising removing the germanium oxide layer; depositing a filler layer in between the plurality of fins; etching the fill layer to a depth, n; depositing a high k layer on the filler layer, and depositing a conductive layer on the high k layer.

10. The method of claim 9, wherein the removing the germanium oxide layer occurs after the oxidizing.

* * * * *